(12) United States Patent
Oki et al.

(10) Patent No.: US 9,743,546 B2
(45) Date of Patent: Aug. 22, 2017

(54) OPTICAL TRANSCEIVER AND METHOD TO ASSEMBLE THE SAME

(71) Applicant: Sumitomo Electric Industries, Ltd., Osaka-shi (JP)

(72) Inventors: Kazushige Oki, Yokohama (JP); Eiichi Banno, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 237 days.

(21) Appl. No.: 14/715,776

(22) Filed: May 19, 2015

(65) Prior Publication Data
US 2015/0342075 A1 Nov. 26, 2015

(30) Foreign Application Priority Data
May 21, 2014 (JP) ................................. 2014-105067

(51) Int. Cl.
| | |
|---|---|
| H04B 10/40 | (2013.01) |
| H05K 7/02 | (2006.01) |
| G01J 1/44 | (2006.01) |
| H01R 12/79 | (2011.01) |
| H05K 3/36 | (2006.01) |
| G02B 6/42 | (2006.01) |

(52) U.S. Cl.
CPC .................. *H05K 7/02* (2013.01); *G01J 1/44* (2013.01); *G02B 6/4281* (2013.01); *H01R 12/79* (2013.01); *H05K 3/363* (2013.01); *Y10T 29/49146* (2015.01)

(58) Field of Classification Search
CPC .......... H04B 10/40; H05K 7/02; H05K 3/363; H01R 12/79; G02B 6/4281

USPC .......................................... 250/239; 398/135
See application file for complete search history.

(56) References Cited

U.S. PATENT DOCUMENTS

| | | | |
|---|---|---|---|
| 6,782,017 | B1 | 8/2004 | Kai et al. |
| 8,380,073 | B2 | 2/2013 | Edwards et al. |
| 2007/0154221 | A1 | 7/2007 | McNicol et al. |
| 2010/0067854 | A1 | 3/2010 | Oki |
| 2013/0148977 | A1 | 6/2013 | Shah et al. |
| 2014/0023368 | A1 | 1/2014 | Bhandare et al. |

(Continued)

FOREIGN PATENT DOCUMENTS

| | | |
|---|---|---|
| JP | 2007-071980 A | 3/2007 |
| JP | 2012-244146 A | 12/2012 |
| JP | 2013-156438 A | 8/2013 |

OTHER PUBLICATIONS

Notice of Allowance in U.S. Appl. No. 14/705,222, dated Jul. 1, 2016.

*Primary Examiner* — Seung C Sohn
(74) *Attorney, Agent, or Firm* — Venable LLP; Michael A. Sartori; F. Brock Riggs

(57) ABSTRACT

A coherent optical transceiver is disclosed. The coherent optical transceiver installs an integrated coherent receiver (ICR), an optical modulator, an intelligent wavelength tunable laser diode (i-TLD), a digital signal processor (DSP), a driver to drive the optical modulator, and so on within a compact housing. The ICR is connected to the printed circuit board (PCB) through flexible printed circuit (FPC) boards and mounted thereon through a holder. The holder forms a gap against the PCB, where the FPC boards pass through the gap and connected on the pads formed on the surface of the PCB beneath the holder.

10 Claims, 17 Drawing Sheets

(56) References Cited

U.S. PATENT DOCUMENTS

| | | | |
|---|---|---|---|
| 2014/0099123 A1* | 4/2014 | Kang | G02B 6/4281 398/135 |
| 2015/0071649 A1* | 3/2015 | Lee | H04B 10/40 398/135 |
| 2015/0326319 A1 | 11/2015 | Oki et al. | |
| 2015/0342075 A1 | 11/2015 | Oki et al. | |

* cited by examiner

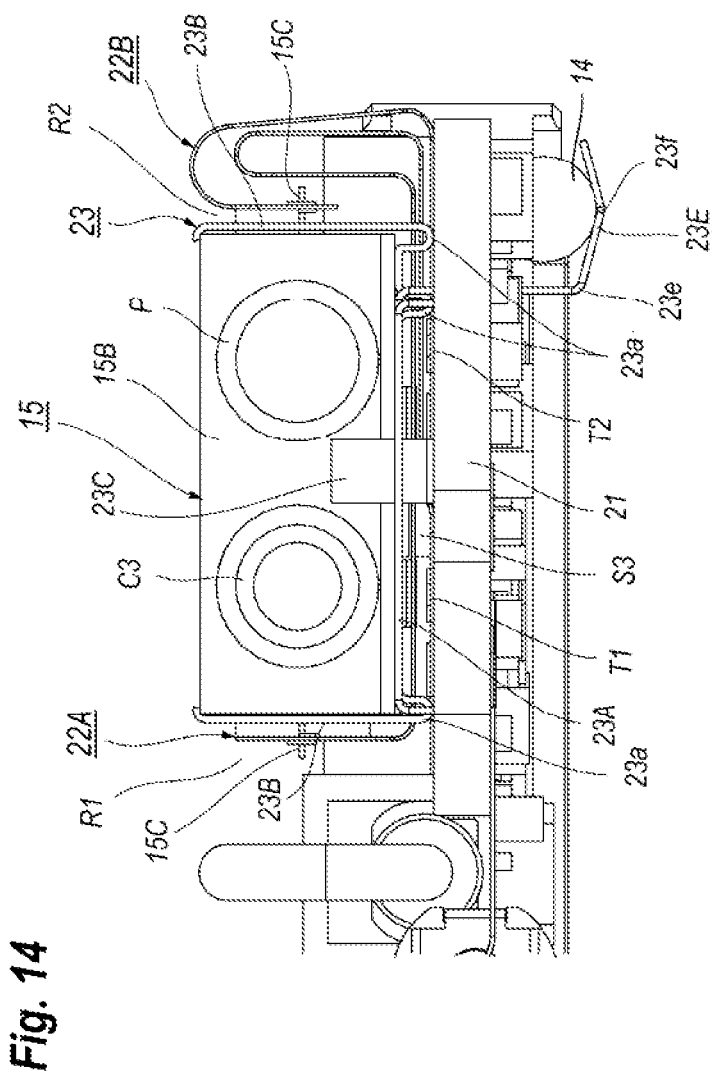

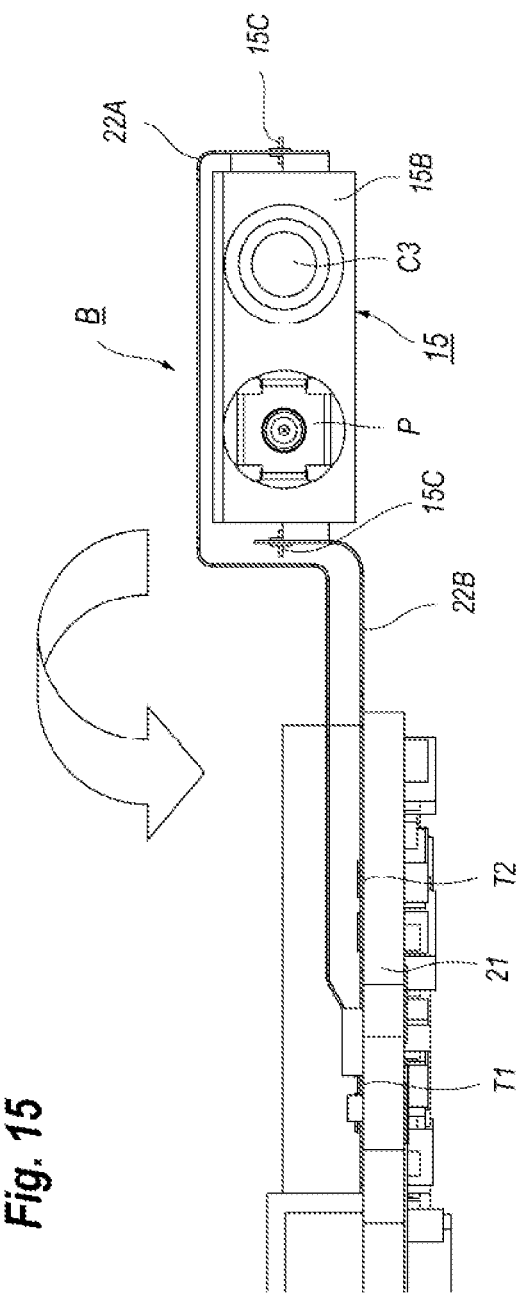

OPTICAL TRANSCEIVER AND METHOD TO ASSEMBLE THE SAME

BACKGROUND OF THE INVENTION

1. Field of the Invention

The present application relates to an optical transceiver, in particular, the present application relates to an optical transceiver capable of performing the coherent optical communication and a method of assemble the optical transceiver.

2. Background Arts

As the mass of the information to be transmitted in the optical communication system drastically increases, new and advanced techniques to expand the transmission capacity has been requested in the field. The coherent system is one of solutions. In the coherent communication, the phase of the light in addition to or substituted from the amplitude of the light becomes the unit of the information. An optical transceiver implemented within the coherent system is necessary to install a local optical beam in addition to an optical signal to be transmitted. The local optical beam is used for recovering the information contained in the optical signal received by the optical transceiver. Accordingly, the optical transceiver is necessary to install, in addition to an optical transmitter and an optical receiver, an optical source to generate the local optical beam, an optical modulator to modulate an optical signal output from the optical source, and complicated electronic circuits to recover the phase information contained in the optical signal. Moreover, when the optical communication system also utilizes the polarization of the transmitted light as the unit of the information, the optical transceiver is necessary to install components above twice as much as that when the polarization is not utilized.

On the other hand, an apparatus or equipment implemented within the communication system has continuously and eagerly requested to make a physical size thereof in compact as long as possible. Accordingly, an optical transceiver used in the coherent communication system, which is often called as a coherent optical transceiver, is necessary to install a lot of optical and electrical components within a compact housing. Various assembling techniques are required to meet such requests.

SUMMARY OF THE INVENTION

An aspect of the present application relates to an optical transceiver comprising an optical module and a printed circuit board (PCB). The optical module receives an optical signal and has a first lead pin in one side thereof. The PCB mounts an electronic circuit that communicates with the optical module through a first flexible printed circuit (FPC) board. The PCB mounts the optical module thereon through a holder. The folder is mounted on the PCB to form a gap against the PCB. A feature of the optical module of the present application is that the first FPC board is fixed to a first pad provided on the PCB by soldering, extracted from the first pad, passes through the gap between the holder and the PCB, and connected to the first lead pin of the optical module. The first pad may be disposed beneath the optical module. Even in such an arrangement, because the first FPC board is extracted from the first pad as passing through the gap between the holder and the PCB, the first FPC board may be reliably and easily soldered with the first pad.

Another aspect of the present application relates to a method to assemble an optical transceiver, where the optical transceiver includes an optical module, a printed circuit board (PCB) that mounts the optical module through a holder and an electronic circuit thereof. The electronic circuit communicates with the optical module through a first flexible printed circuit (FPC) board. The method comprises steps of: soldering an end of the first FPC board with a first pad provided in the PCB; soldering another end of the first FPC board with a first lead pin provided in a side of the optical module; setting a holder on the PCB such that the holder hides the pad on the PCB; winding the first FPC board around the optical module; and setting the optical module on the holder.

BRIEF DESCRIPTION OF THE DRAWINGS

The foregoing and other purposes, aspects and advantages will be better understood from the following detailed description of a preferred embodiment of the invention with reference to the drawings, in which:

FIG. 9 illustrates the housing in bottom up;

FIG. 14 is a front view shows positional relations between the ICR, the holder, the FPC and the PCB;

FIG. 15 schematically shows a process to assemble the ICR and the FPC on the PCB;

DESCRIPTION OF EMBODIMENTS

Next, some preferable embodiments according to the present application will be described. In the description of drawings, numerals or symbols same with or similar to each other will refer to elements same with or similar to each other without duplicated explanations.

Figure 1:
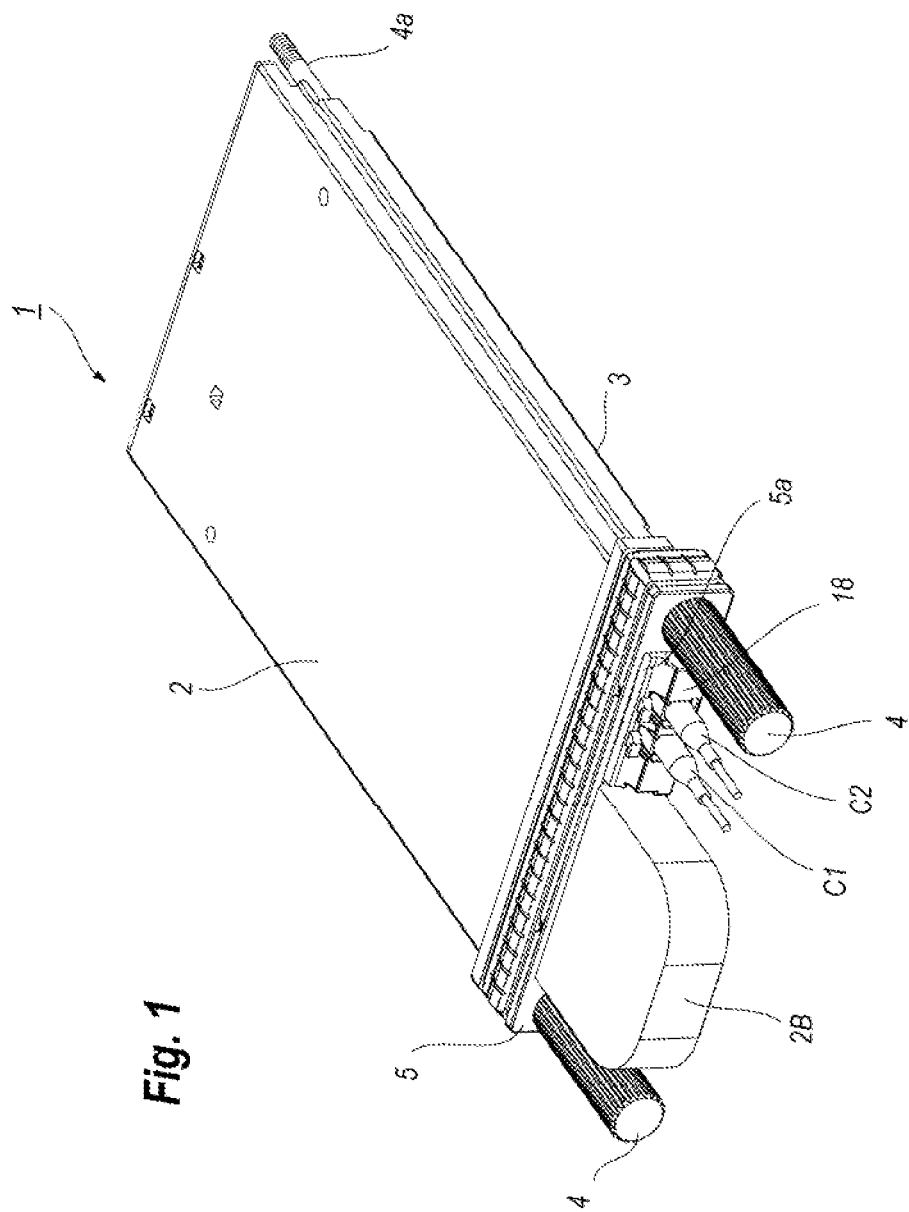
FIG. 1 is an outer appearance of an optical transceiver according to the present embodiment.

FIG. 1 shows a perspective drawing of an optical transceiver 1 according to the present embodiment. The optical transceiver 1, which follows the multi-source agreement (MSA) of what is called, Centium Form factor Pluggable (CFP), includes a top housing 2, a bottom housing 3, two fastening screws 4, and a front panel 5. The description below assumes that "front" or "forward" corresponds to a side where the front panel is provided, "rear" corresponds to a side opposite to the front, and a direction from the front to the rear is longitudinal direction. However, these descriptions are only for explanation sakes and do not narrow the scope of the present invention.

The top and bottom housings, 2 and 3, which are made of metal die casting, has a longitudinal length of 144 mm from the front panel 5 to the rear end, and a width of 82 mm in the front panel 5. Respective sides of the front panel 5 provide fastening screws 4 to latch the optical transceiver 1 with the host system.

Figure 2:
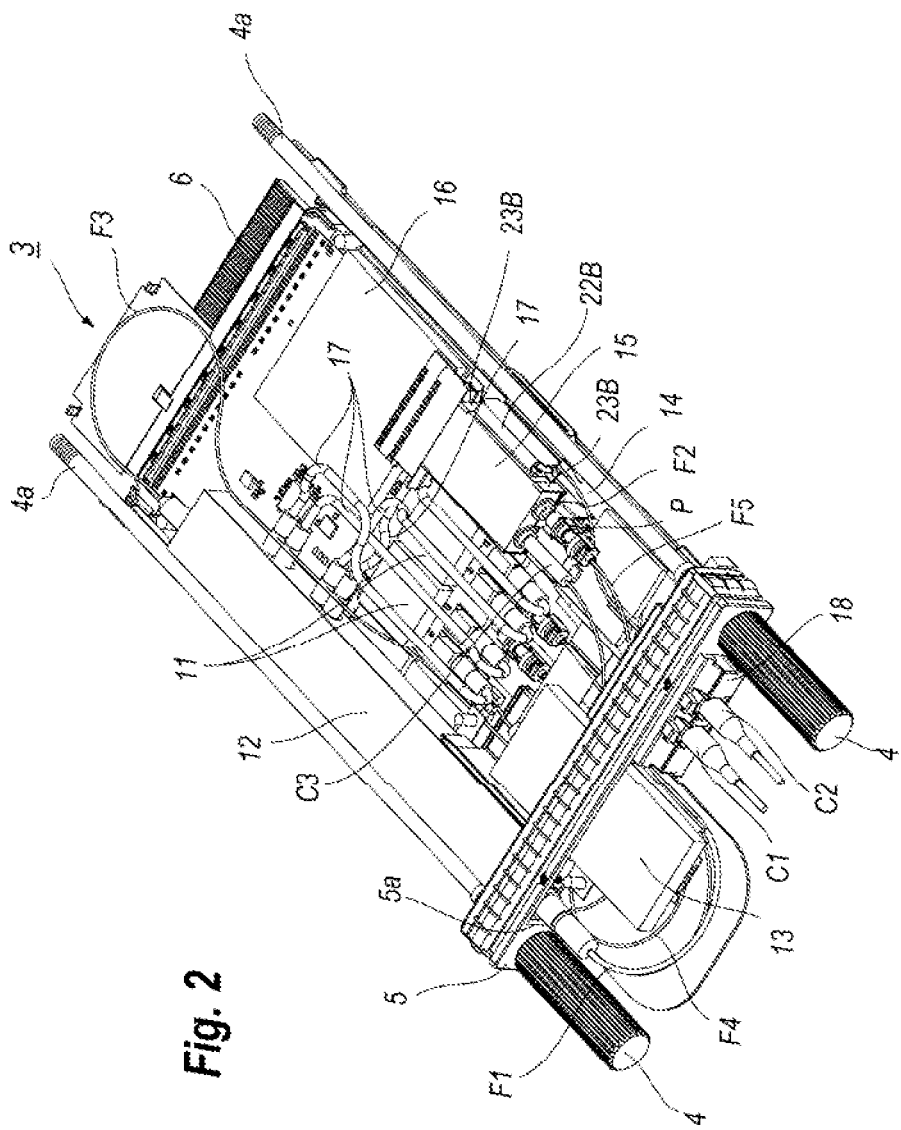
FIG. 2 shows an inside of the optical transceiver.
Figure 3:
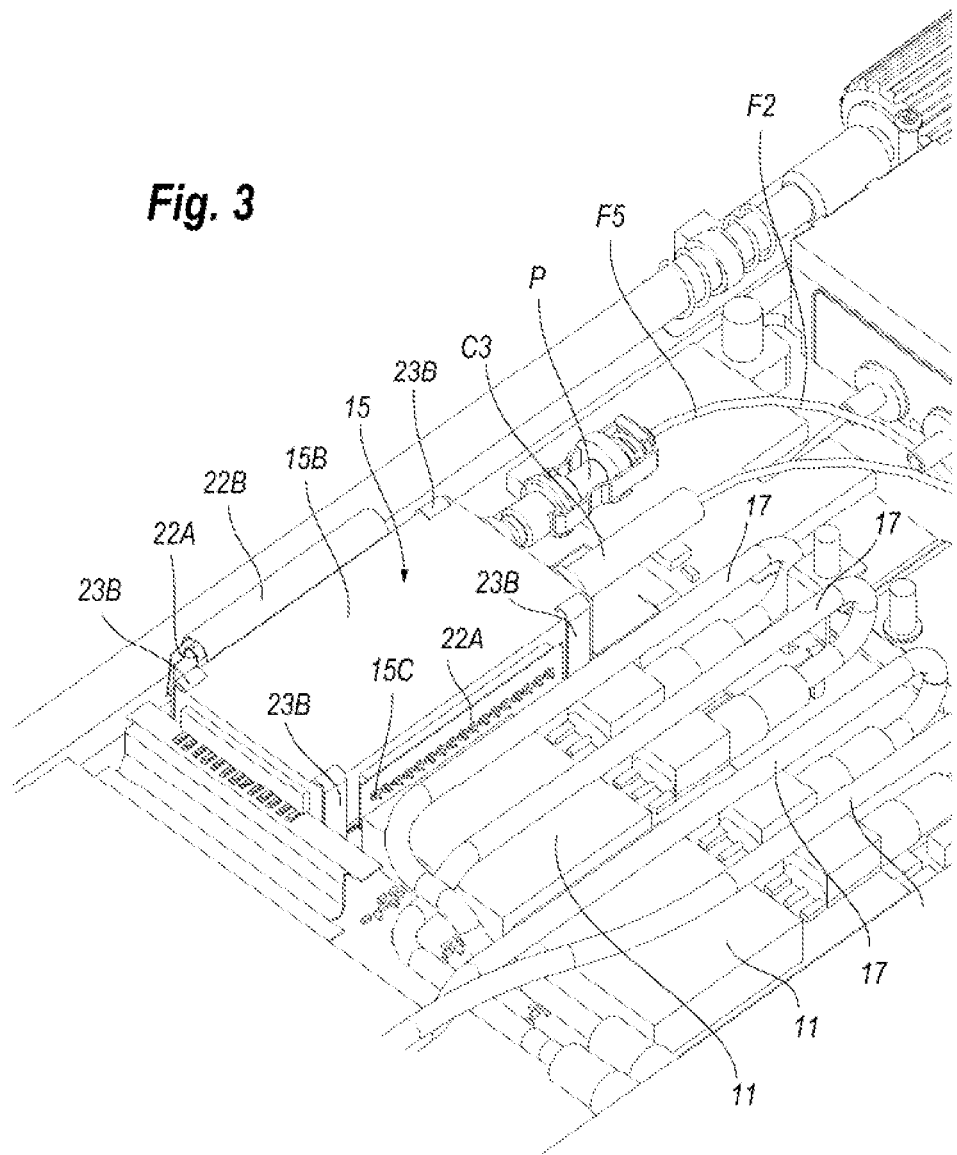
FIG. 3 magnifies a primary portion inside of the optical transceiver.
Figure 4:
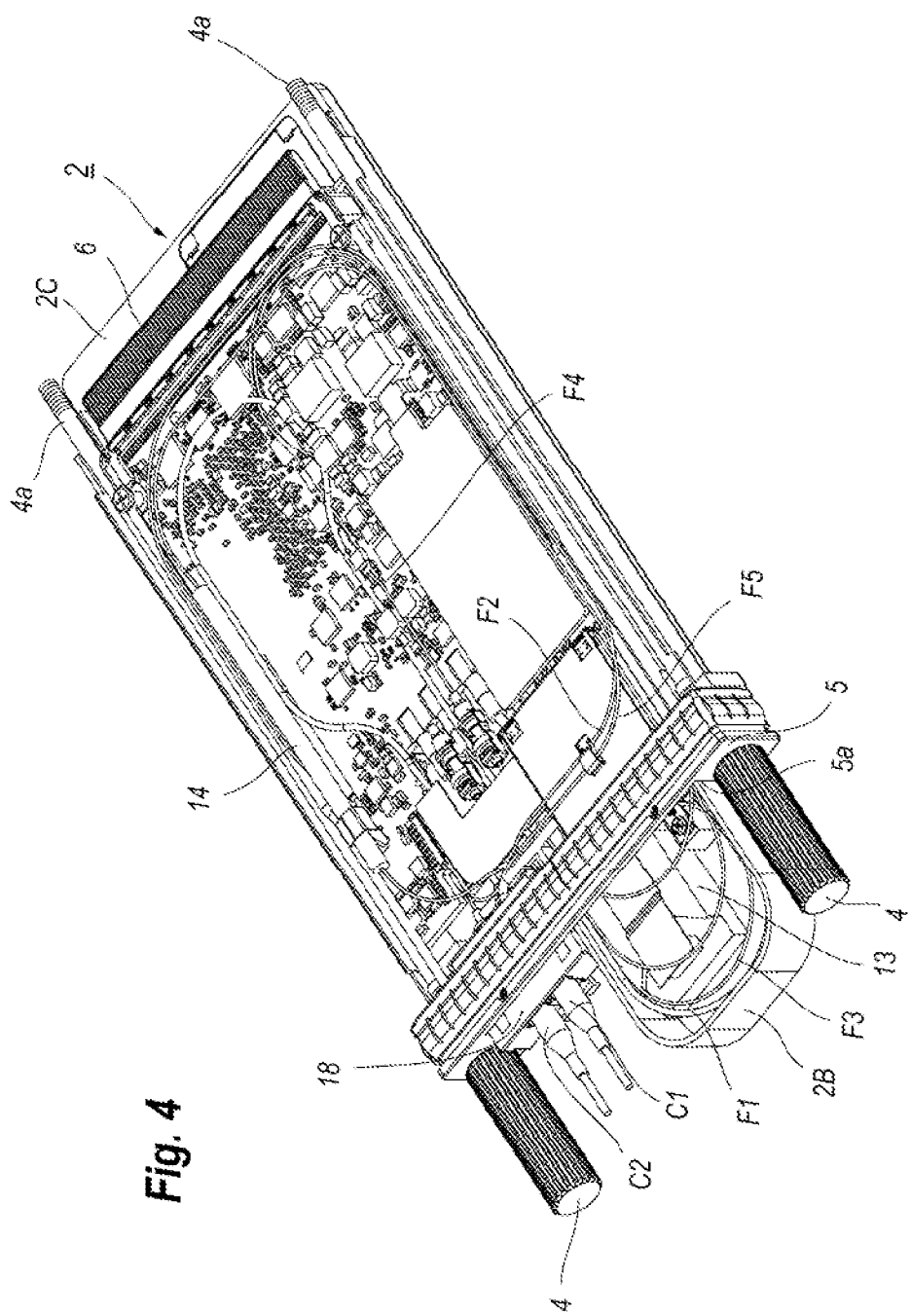
FIG. 4 views the inside of the optical transceiver from the bottom by removing the bottom housing.

FIG. 2 shows an inside of the optical transceiver 1 viewed from the top; FIG. 3 magnifies a primary portion of the optical transceiver 1; and FIG. 4 views the inside of the optical transceiver 1 from the bottom by removing the bottom housing 3. As shown in FIGS. 2 to 4, the fastening screws 4 are set in the pockets 3a illustrated in FIG. 9 formed by the top and bottom housings, 2 and 3, in respective sides of the optical transceiver 1. The rear ends 4a of the fastening screws 4 extrude from the electrical plug 6 provided in the rear end of the optical transceiver 1. Mating the electrical plug 6 with an electrical connector prepared in the host system, the fastening screws 4 may be fastened with the electrical connector.

Specifically, the end 4a of the fastening screw 4 extrudes in respective outer sides of the electrical plug 6 which provides terminals for radio frequency (RF) signals and those for power supplies, a total number of which exceeds 100 counts with a pitch of 0.8 mm. Mating the end 4a of the fastening screws 4 with female holes provided in respective sides of the optical connector, the optical transceiver 1 may be securely and precisely set in the host system and communicate with the host system.

Inner space formed by the top and bottom housings, 2 and 3, installs two drivers 11, an optical modulator 12, an intelligent tunable laser assembly (iTLA) 13, a polarization maintaining coupler (PMC) 14, an integrated coherent receiver (ICR) 15 as an optical module, a digital signal processor (DSP) 16, semi-rigid cables 17, and an optical receptacle 18. Some of those elements are mounted on a circuit board 21. In the present optical transceiver 1, the electrical plug 6 is independent of the circuit board 21.

The inner space of the optical transceiver 1 installs the optical modulator 12, which has an extended and slim rectangular housing, in a side along the driver 11. Four semi-rigid cables 17 electrically connect the driver 11 with the optical modulator 12. The semi-rigid cable 17 is a co-axial cable sheathed with, for instance, copper so as to be flexibly and freely bent and to keep a bent shape. Accordingly, the semi-rigid cable 17 enhances the flexibility of the arrangements of respective components within the inner space.

Also, the optical transceiver 1 provides inner fibers, F1 to F5. Five inner fibers, F1 to F5, are enclosed within the inner space in the present embodiment. These inner fibers, F1 to F5, optically couple the optical modulator 12, the iTLA 13, the PMC 14, the ICR 15, and the optical receptacle 18. Specifically, the inner fiber F1, which is brought out in forward from the optical modulator 12 then turned rearward, and couples the optical modulator 12 with the optical receptacle 18. Details of the arrangements of the inner fibers, F1 to F5, will be described later. Four optical signals modulated by the optical modulator 12 are multiplexed therein and output through the optical connector C1 set in the optical receptacle 18. Also, an external optical signal is input to the other optical connector C2.

The optical receptacle 18 is exposed from the front panel 5. The optical receptacle 18 is also coupled with the ICR 15 through another inner fiber F2 which extends rearward from the optical receptacle 18 and makes a round within the inner space. The external signal input to the optical connector C2 enters the ICR 15 as being carried on the inner fiber F2. The iTLA 13 pierces through the opening 5a in the front panel 5. The PMC 14 is set in a rear of the optical receptacle 18 and in side by side to the driver 11. The DSP 16 is placed in the rear of the ICR 15. The front panel 5 in the opening 5a thereof exposes not only the iTLA 13 but the optical receptacle 18 as receiving the optical connectors, C1 and C2.

Figure 5:
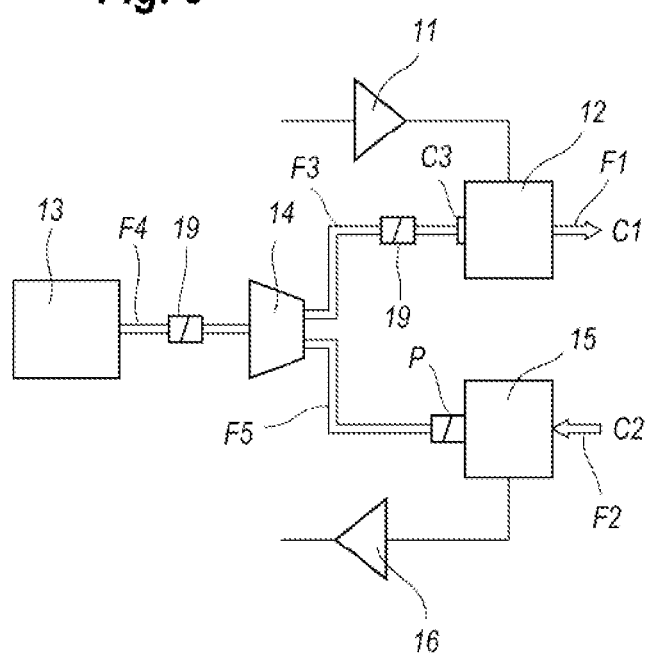
FIG. 5 schematically illustrates a functional block diagram of the optical transceiver primary in the optical system thereof.

FIG. 5 schematically illustrates a functional block diagram of the optical transceiver 1 primarily in the optical system thereof. Lines except inside thereof correspond to the optical paths, while, solid lines denote electrical paths. The iTLA 13 generates an optical signal with a wavelength in a band of 1.55 μm, specifically, 1.53 to 1.57 μm.

Figure 6:
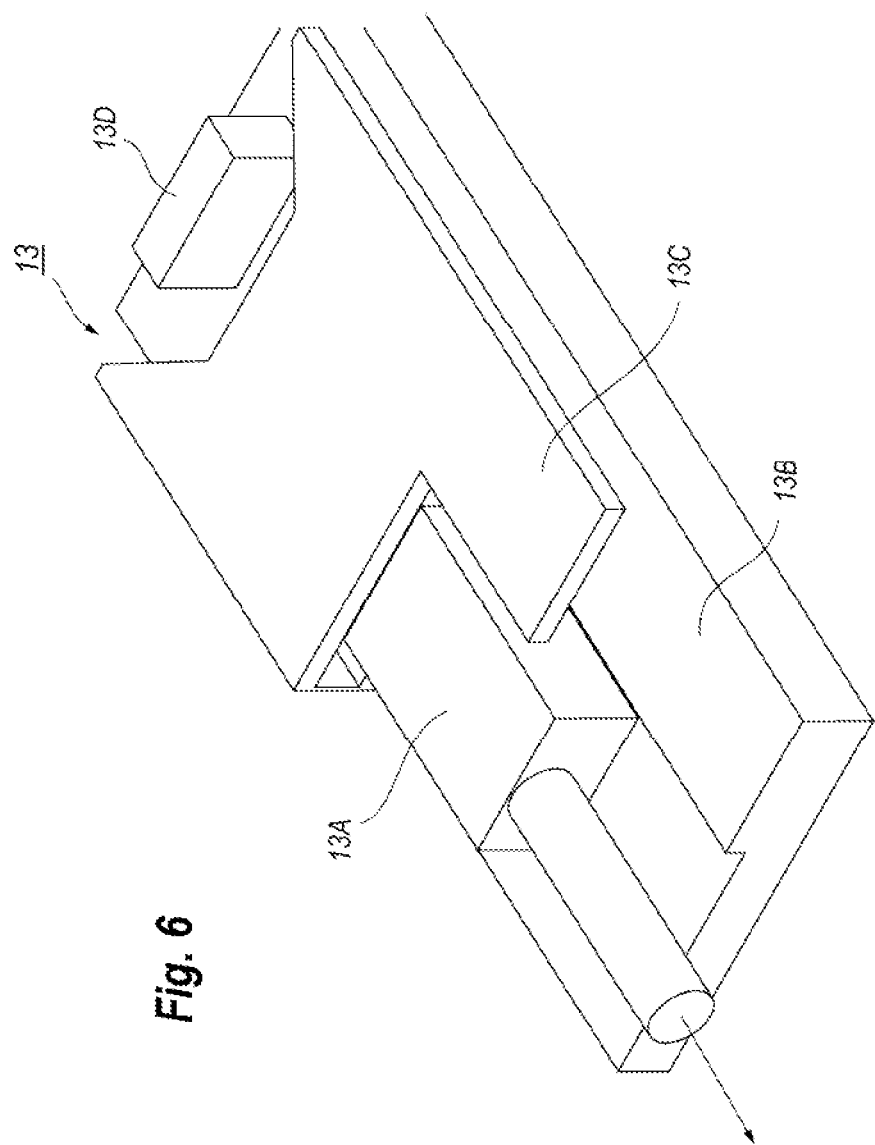
FIG. 6 is a perspective view of the iTLA.
Figure 7:
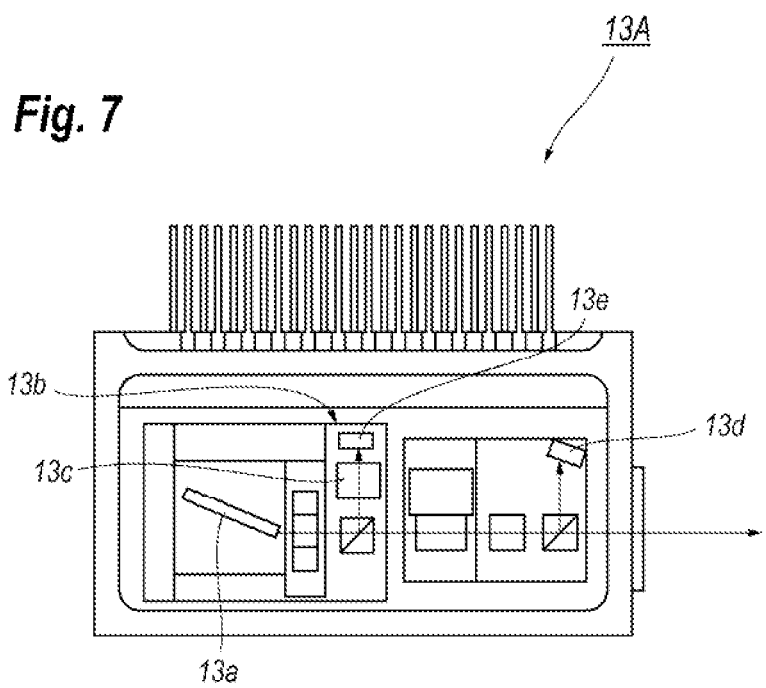
FIG. 7 schematically shows the inside of the LD module.

FIG. 6 is a perspective view of the iTLA 13. The iTLA 13 includes an LD module 13A that generates the optical signal, a base 13B, a circuit board 13C, and a connector 13D. A flexible printed circuit (FPC) board coupled with the connector 13D electrically connects the iTLA with circuits mounted on the mother board in the optical transceiver 1. FIG. 7 schematically shows the inside of the LD module 13A, which installs an LD 13a, a wavelength detector 13b including an etalon filter 13c, monitor photodiodes (mPD), 13d and 13e, and so on. The LD 13a may generate laser emission with a line width thereof substantially equal to or narrower than 100 kHz. The wavelength band around 1.55 μm corresponds to the oscillation frequency of about 1.95 THz. Accordingly, the line width of around 100 kHz is equivalent to the stability of about $5 \times 10^{-8}$.

Referring again to FIG. 5, the local beam output from the iTLA 13 is split by the PMC 14 as maintaining the polarization thereof. The polarization of the local beam is in parallel to the active layer of the LD 13a, that is, because the LD 13a enclosed within the housing of the LD module 13A is assembled substantially in parallel to the bottom thereof, the polarization of the local beam output from the LD module 13A is kept in substantially in parallel to the bottom of the housing. One of the local beams split by the PMC 14 enters the optical modulator 12, but the other reaches the ICR 15. The optical modulator 12, which has a type of the LN modulator comprised of lithium niobate, modulates thus provided one of local beams based on the modulation signals provided from the driver 11 through the semi-rigid cables 17. The modulation signals may have a frequency exceeding 10 GHz, sometimes reaching 40 GHz. The modulation signals thus provided correspond to Ix, Iy, Qx, and Qy, each containing one information unit, where I and Q mean the in-phase and quadrature, respectively; while, x and y correspond to the polarizations. Thus, the optical modulator 12 may perform the DP-QPSK modulation.

Figure 8:
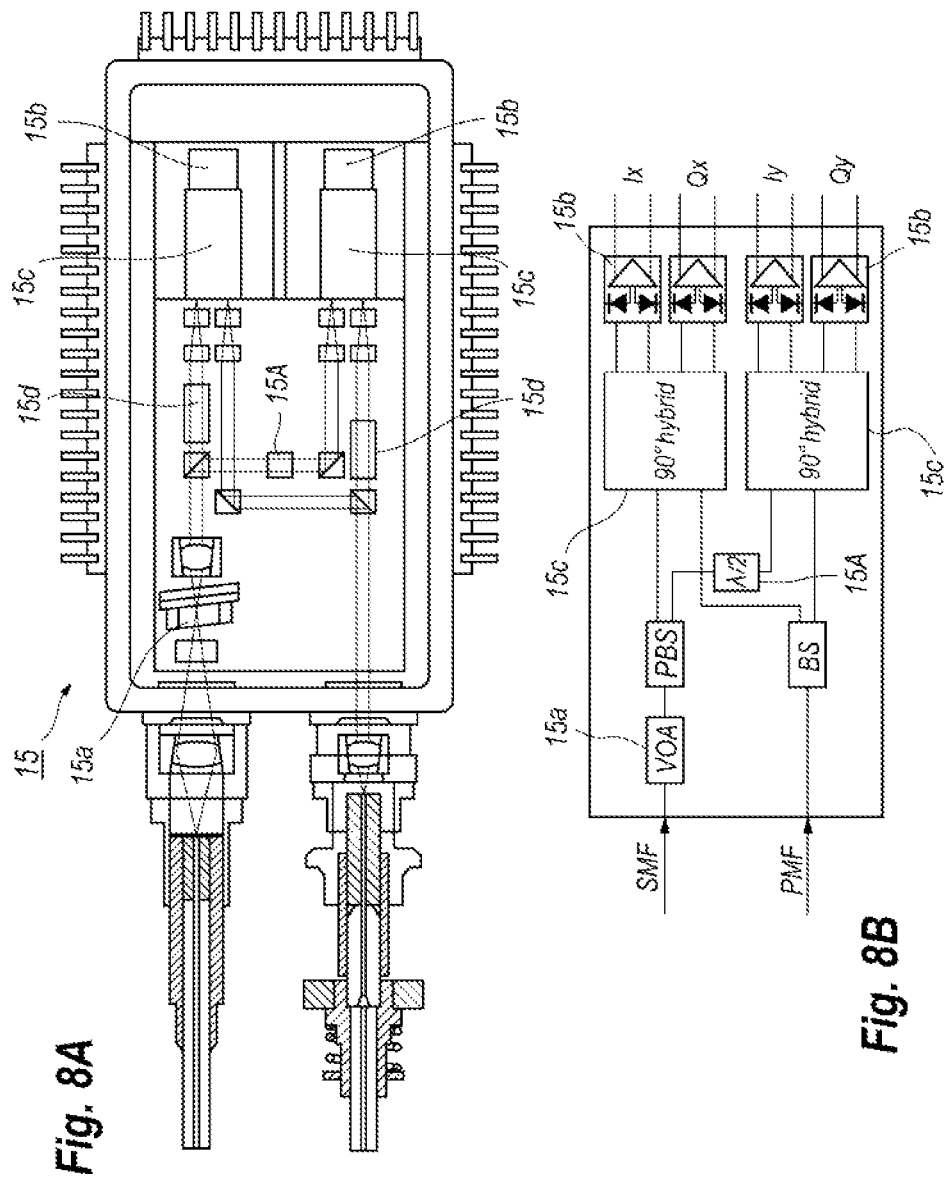
FIG. 8A schematically illustrates the inside of the ICR.
FIG. 8B shows a functional block diagram of the ICR.

The ICR 15, which receives the other of the local beams splits by the PMC 14, extracts the phase information of the input optical signal provided from the optical connector C2 by performing the multiplication of two optical beams. FIG. 8A schematically illustrates the inside of the ICR 15, and FIG. 8B is a functional block diagram of the ICR 15. As shown in FIG. 8A, the ICR 15 includes a variable optical attenuator (VOA) 15a; two PD units 15b each corresponding to respective polarizations and including two channels for the in-phase signal (I) and the quadrature phase signal (Q), respectively; two 90° hybrids 15c to perform the multiplication of two beams; two skew adjustors 15d; and some optical components such as a polarization beam splitter (PBS), a BS and lenses. The ICR 15 further provides a half-wave plate (λ/2 plate) 15A to rotate the polarization of the optical signal in the path from the signal side to the local side, while, the local beam provided from the polarization maintaining fiber (PMF) is kept in the polarization thereof until respective hybrids 15c.

Specifically, referring to FIG. 8B, the ICR 15 receives the local beam from the iTLA 13 through the PMF and the signal beam from the optical connector C2 through the signal mode fiber (SMF). Each beam is split into two beams by the BS and the PBS. One of 90° hybrids multiplies one of the signal beams split by the PBS with one of the local beams split but by the BS to generate the in-phase and the quadrature phase signals for the X-polarization, Ix and Qx, respectively. The other 90° hybrids 15c multiples one of signal beams but passing through the λ/2 plate 15A with one of the local beams to generate the in-phase and the quadrature phase signals for the Y-polarization, Iy and Qy, respectively. Because the optical components set in the paths for the local beam and the signal beam except for the λ/2 maintain the polarization, respective 90° hybrids may exactly generate the signals for two polarizations. Four generated signals, Ix to Qy, are provided to the DSP 16 to recover information contained in the input optical signal. The DSP 16 provides the information thus recovered to the host system.

The optical modulator 12, the iTLA 13, and/or the ICR 15 are necessary to be provided with a lot of DC biases for the stable operations thereof. For instance, the optical modulator 12 needs, in addition to the driving signals, biases to compensate the phases of the optical beams, to balance respective power of the optical outputs, and/or to monitor respective optical outputs. The iTLA 13 requires, in addition to the bias current to generate an optical beam, to control the wavelength of the optical beam in the target one, to monitor the power of the output beam, and so on. Also, the ICR 15 is necessary to be provided with biases for PDs and pre-amplifiers installed therein, commands to adjust the gains of the pre-amplifiers, and so on. The optical transceiver 1 provides such many biases by respective FPCs from the mother board. An optical transceiver 1 for the coherent communication system is inevitably requested to enclose those electrical and optical components within a housing whose outer dimensions are precisely determined in MSAs. Next, details of the housing of the optical transceiver 1 of the present embodiment will be described.

Figure 9:
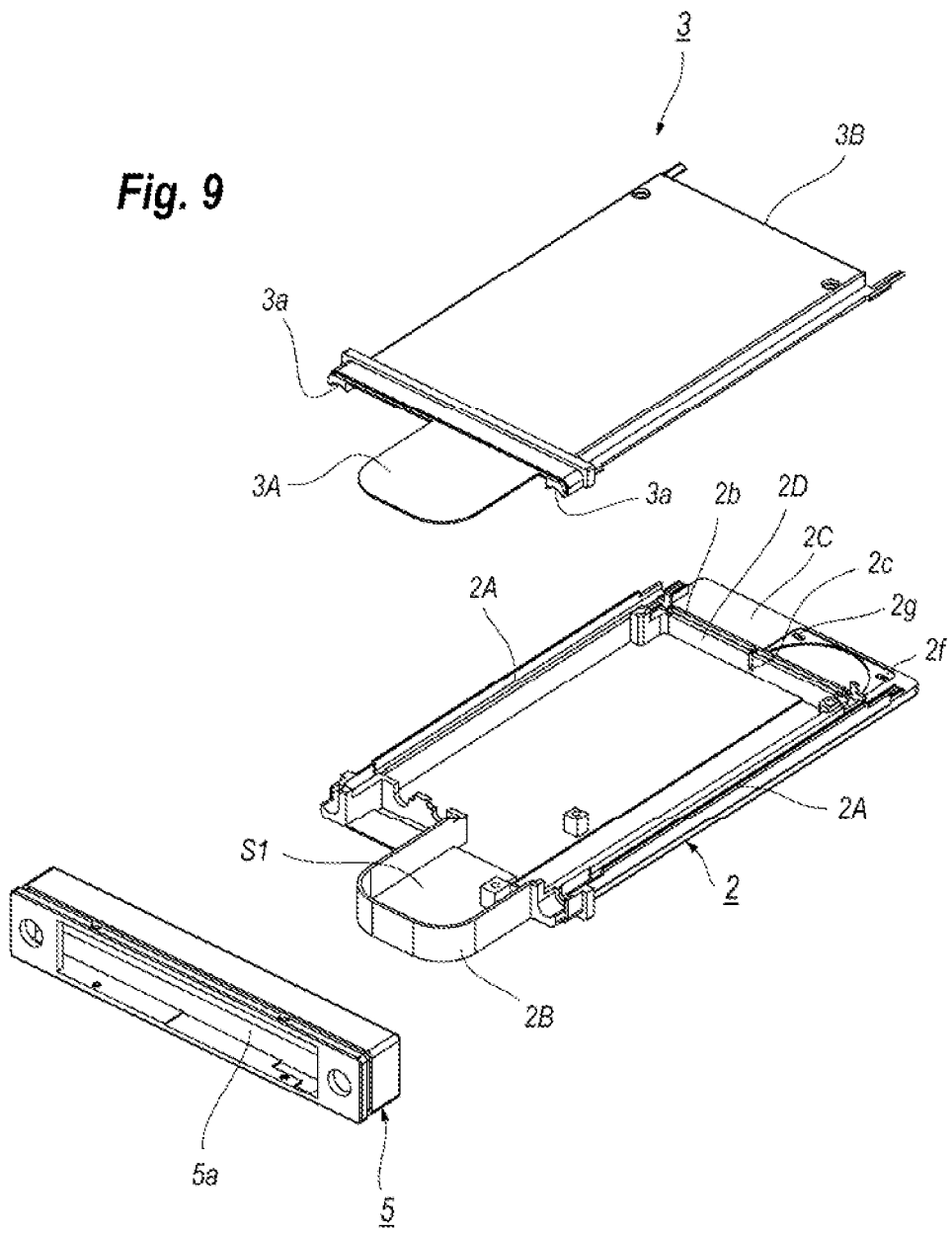
FIG. 9 is an exploded view of the housing, the top and bottom housings, and the front panel, where

FIG. 9 is an exploded view of the housing, namely, the top and bottom housings, 2 and 3, and the front panel 5, where FIG. 9 illustrates the housing in bottom up. The top housing 2 provides in respective sides the cavities 2A from the front to the rear to set the fastening screws 4 therein. The fastening screws 4 pierce the front panel 5, the cavities 2A, and protrude from the rear end. The top housing 2 also provides an extension 2B extending forward from the opening 5a of the front panel 5. The extension 2B secures a front auxiliary area S1 covered with a ceiling 3A of the bottom housing 3. Although the extension 2B protrudes from the front panel 5, the extension 2B does not interfere with the installation of the external fiber extracted from the optical connectors, C1 and C2.

Figure 10:
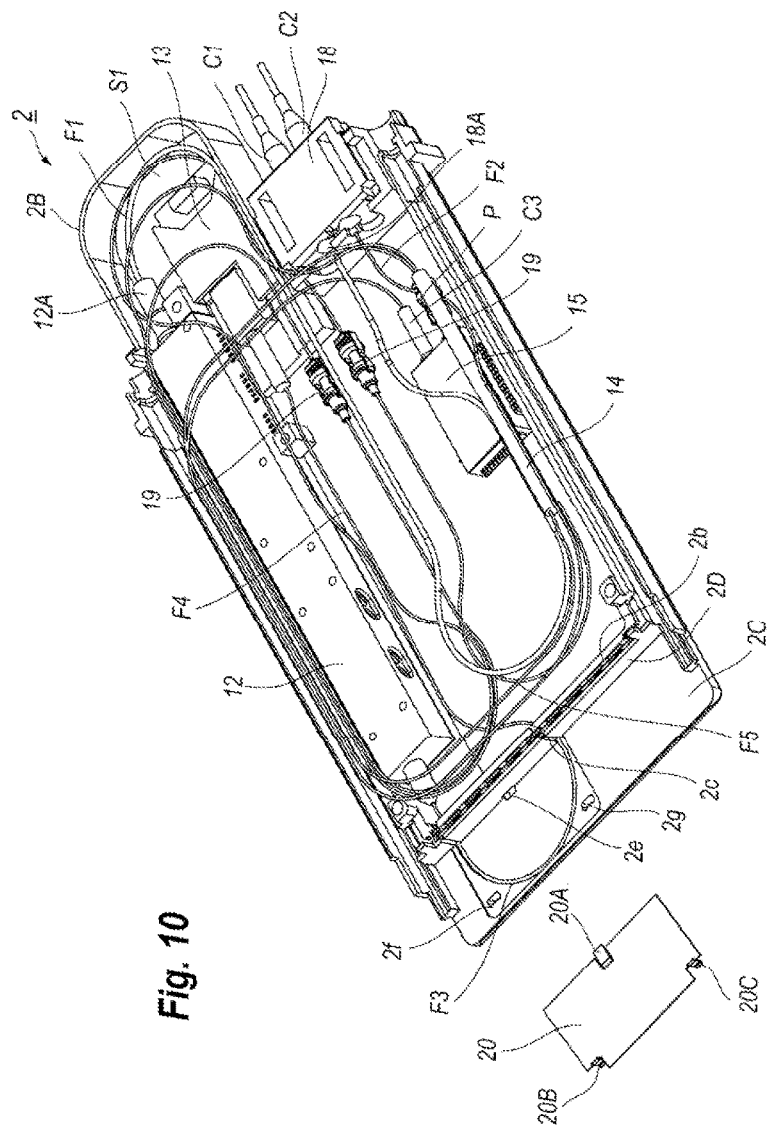
FIG. 10 illustrates the arrangement of the components and the wiring of the inner fibers within the space.

FIG. 10 illustrates the arrangement of the components and the wiring of the inner fibers within the housing 2. The front auxiliary area S1 installs the front portion of the optical modulator 12. Accordingly, even when the optical modulator 12 in the dimensions thereof, in particular, the longitudinal length thereof, is longer than the longitudinal length of the optical transceiver 1 whose outer dimensions follows the CFP standard, the optical transceiver 1 may build an optical modulator of the MZ type primarily made of dielectric material such as lithium niobate ($LiNbO_3$). Because of smaller electrical-optical interactive co-efficient of dielectric materials, an optical modulator made of such material requires a length to show a substantial modulation degree. Without the front auxiliary area S1, no optical modulator of the MZ type made of dielectric material is available to be installed within the optical transceiver following the CFP standard. Moreover, the front auxiliary area S1, or the front extension 2B, does not interfere with the function of the optical transceiver 1 to be plugged within the host system and communicate therewith. That is, the CFP standard is silent for the arrangement of the front panel, only sets the limitation that the optical connector provided in a CFP transceiver is to have the type of the LC connector. Accordingly, the optical transceiver 1 of the present embodiment is an exclusive solution to install an optical modulator with the MZ type primarily made of dielectric materials.

Figure 11:
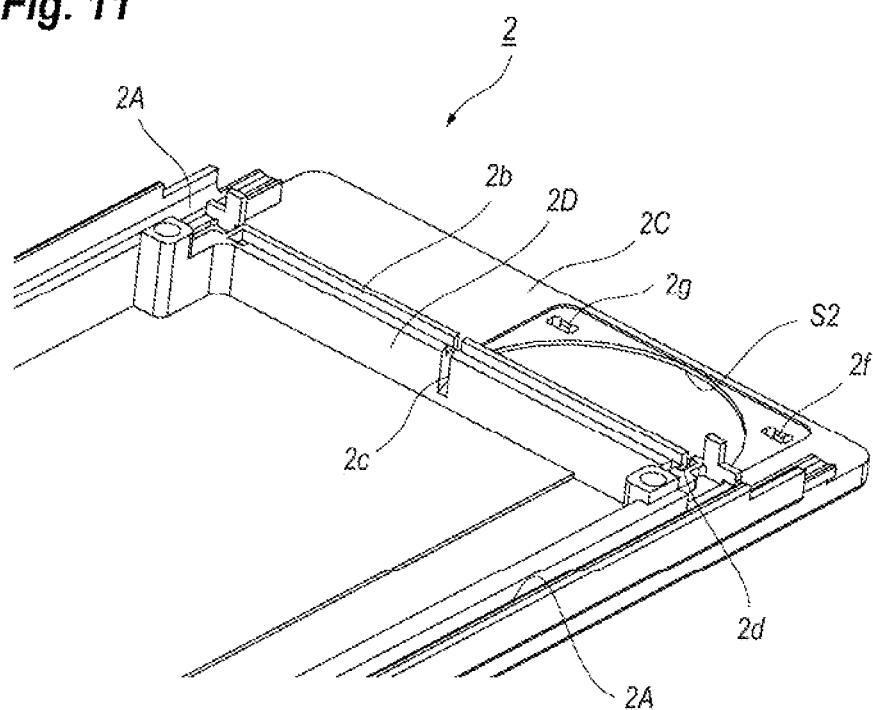
FIG. 11 magnifies the rear portion of the top housing.

The top housing 2 provides in a rear end thereof a rear wall 2D and an eaves 2C extending outwardly from the rear wall 2D. The rear wall 2D faces the rear end 3B of the bottom housing 3 as shown in FIG. 9. That is, the rear wall 2D, and the top and bottom housings, 2 and 3, form the inner space to install the components therein. Referring to FIG. 11, which magnifies the rear portion of the top housing 2, the rear wall 2D sets the electrical plug 6 thereon. As described later, the electrical plug 6 does not interfere with the wiring of the inner fiber F3 extracted from the rear wall 2D and returning back into the inner space of the optical transceiver 1.

The rear wall 2D also provides a groove 2b on a top thereof into which a gasket is set to shield the inner space, and two slits, 2c and 2d, in a center and a side thereof, respectively. The side slit 2d is formed in a position lust behind the optical modulator 12. Referring to FIG. 10, the inner fiber F3 passes these slits, 2c and 2d. Specifically, the inner fiber F3 pulled out from the optical modulator 12 passes the rear wall 2D through the side slit 2d, rounded in the rear auxiliary area S2, returns back to the inner space passing through the center slit 2c, and reaches the PMC 14 from the rear after running along the optical modulator 12 frontward, turned backward in the front auxiliary area S1, passing the inner connector 19, and turned again frontward. Another inner fiber F4 extracted from the iTLA 13 rearward reaches the PMC 14 from the front by rounding twice the optical modulator 12.

The inner fiber F1, which extends from the PMC 14 rearward, crosses laterally in the rear end of the inner space, runs frontward between the optical modulator 12 and one of the side walls, turns rearward in the front auxiliary area S2, and finally reaches the plug P provided in the front wall of the ICR 15. The inner fiber F2, extracted rearward from the optical connector C2, rounds the inner space and reaches the other connector C3 also provided in the front wall of the ICR 15.

The last inner fiber F1, which is extracted rearward from the other optical port 18A of the optical receptacle 18, reaches the optical modulator 12 from the front by being rounded in the rear of the inner space, running in the center thereof, and rounded again rearward in the front auxiliary area S2. That is, the inner fiber F1 reaches the optical modulator 12 from the port 18A as shaping an S-character. Two inner fibers, F3 and F4, which are coupled with the PMC 14, provide respective inner connectors 19. Moreover, the inner fiber F5, which is also coupled with the PMC 14, has the plug P in the end to the ICR 14 to maintain the polarization direction thereof. Thus, the PMC 14 may be replaced by detaching respective connectors.

Figure 12:
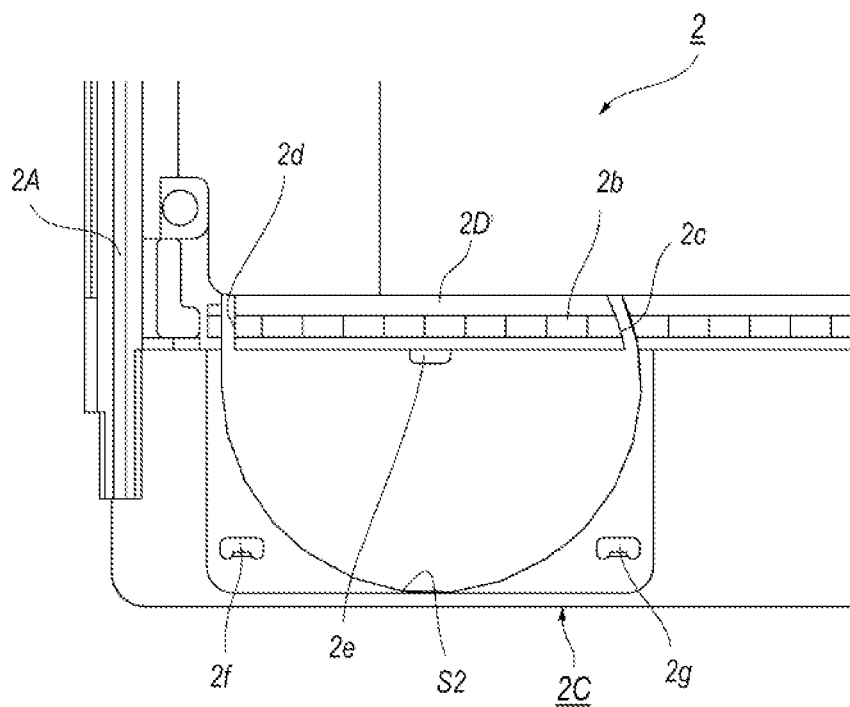
FIG. 12 is a plan view of the rear portion illustrated in FIG. 11.

The optical transceiver 1 of the embodiment further provides a cover 20 to cover the rear auxiliary area S2 into which the inner fiber F3 is set. The inner fiber F3, which passes the rear wall 2D through the side slit 2d behind the optical modulator 12, rounds along the periphery of the rear auxiliary area S2 and returns the inner space as passing through the center slit 2c. The cover 20 covers the inner fiver F3 in the rear auxiliary area S2. The cover 20 is assembled with the top housing 2 by engaging three latches, 20A to 20C, with three holes, 20e to 20g, provided in the extension 2C of the top housing 2, as shown in FIGS. 11 and 12, where FIG. 11 is a perspective view of the rear of the top housing and FIG. 12 is a plan view thereof.

The extension 2C of the top housing 2 provides a hollow corresponding to the shape of the rear auxiliary area S2. The hollow has a diameter greater than 15 mm, which is a smallest diameter allowable for an ordinary single mode fiber. Setting the inner fiber F3 along the periphery of the area S2, the round diameter of the inner fiber F3 automatically becomes greater than 15 mm. The bent loss of the inner fiber F3 may be thus suppressed.

The optical transceiver 1 of the present embodiment thus described provides the front auxiliary area S1 protruding from the front panel 5. The front auxiliary area S2 installs the front portion of the optical modulator 12 and that of the iTLA 13. In particular, because the optical modulator having an enough longitudinal dimension to secure the electrical to optical interaction of the dielectric material may be partially set within the front auxiliary area S1, the optical transceiver 1 may be applicable for the coherent communication system. Also, the inner fibers, F1 to F5, are rounded in the front auxiliary area S1, the installation of the inner fibers, F1 to F5, may be effectively carried out without causing unnecessary bending stress in the inner fibers, F1 to F5.

Also, the optical transceiver 1 of the present embodiment provides the rear auxiliary area S2 in the outside of the rear wall 2D. The rear auxiliary area S2 may provide a space to set and round the inner fiber F3 there by a bending diameter greater than 15 mm. The inner fiber F3 passes the side slit 2d behind the optical modulator 12, rounds along the periphery of the auxiliary area S2, and passes the rear wall 2D again through the center slit 2c. Thus, the auxiliary area S2 may secure the bending diameter greater than 15 mm. The inner fiber F3 in the rear auxiliary area 52 may be securely protected by the cover 20.

Figure 13:
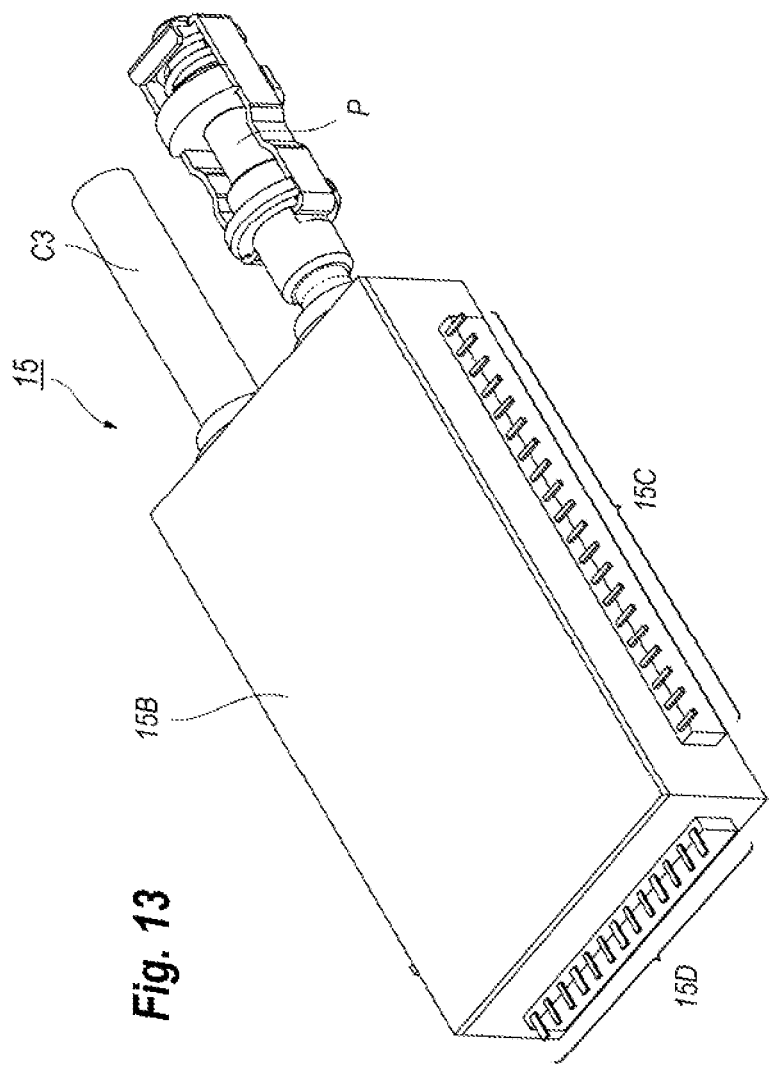
FIG. 13 is a perspective view of the ICR.

Next, arrangements around the ICR 15, namely, the ICR 15 itself, the PCB 21 and two FPCs, 22A and 22B, will be described as referring to FIGS. 13 and 14. Two FPCs, 22A and 22B, electrically connect the ICR 15 with circuits implemented on the PCB 21. The ICR 15 has a box-shaped housing 15B with DC leads 15C and RF leads 15D, where the former leads 15C are arranged in respective sides of the box-shaped housing 15B, and the latter leads 15D are provided in the rear side thereof. In the explanation below, the direction of "front" corresponds to the side the optical connectors, C3 and P, are arranged, and the other direction "rear" means the side where the RF leads 15D are provided. In the optical transceiver 1 of the present embodiment, two FPCs, 22A and 22B, coupled with the DC leads 15C are devised in the arrangement from a viewpoint of how to install the ICR 15 within the densely packed housing of the optical transceiver 1 as soldering the FPCs, 22A and 22B, with pads on the PCB 21.

The ICR 15 is mounted on the PCB 21 as putting a holder 23 on the PCB 21. Two FPCs, 22A and 22B, are soldered to the pads, T1 and T2, on the PCB 21 as passing through a gap formed between the holder 23 and the PCB 21. Specifically, referring to FIG. 14, one of the FPCS 22A is pulled downward from the DC leads 15C arranged in the center side R1 of the IRC 15, bent outward in a right angle, passing a gap S3 formed under the holder 23, bent upward in the side R2 in a right angle, rounded so as to make an U-shape, bend toward the gap S3, then soldered to the pad T1 on the PCB 21. The pad T1 is formed beneath the holder 23 and arranged in the center side of the PCB 21. The other FPC 22B is pulled upward from the DC leads 15C arranged in the outer side of the ICR 15, rounded so as to form the U-shape, bent inward in the side R2, passing beneath the former FPC 22A, then soldered to the other pad 12, which is also formed beneath the ICR 15 and in the outer side of the PCB 21 compared with the former pad T1. The curvature of the U-shape of the latter FPC 22B is smaller than the curvature of the U-shape of the former PCB 22A. That is, the former FPC 22A is rounded inside of the latter FPC 22B.

As described above, two pads, T1 and T2, are formed beneath the holder 23, or the ICR 21. Accordingly, the visual inspection of the pads, T1 and T2, or the soldering thereto is impossible after the PCB 21 mounts the holder 23 and the ICR 15. Accordingly, the process to assemble the ICR 15 with the PCB 21 first performs the soldering of the FPCs, 22A and 22B, to the pads, T1 and T2, then installs the holder 23 on the PCB 21, and lastly, sets the ICR 15 on the holder 23. FIG. 15 schematically shows the process to install the ICR 15 on the PCB 21.

Referring to FIG. 15, the process first carries out the soldering of the FPCs, 22A and 22B, with the DC leads 15C of the ICR 15 to produce an intermediate assembly B. Note that, one of the FPC 22A is pulled out from the DC lead 15C along one direction, but the other FPC 22B is brought out in another direction opposite to the former direction. Then, two FPCs, 22A and 22B, are soldered to respective pads, T1 and T2, on the PCB 21. The FPC 22A is soldered to the pad T1 arranged in the center of the PCB 21, and the other FPC 22B is soldered to the pad T2 in the outer side on the PCB 21. Because the ICR 15 is free from the holder 23, that is, the holder 23 is yet assembled with the ICR 15, the soldering of the FPCs, 22A and 22B, with the pads, T1 and T2, may be easily carried out. Setting the holder 23 on the PCB 21, and setting the ICR 15 on the holder 23 as rolling the intermediate assembly B as shown in FIG. 15, the ICR 15 may be mounted on the PCB 21 as interposing the holder 23 against the PCB 21. Finally, the RF leads 15D is connected to the PCB 21 by another FPC.

Figure 16A:
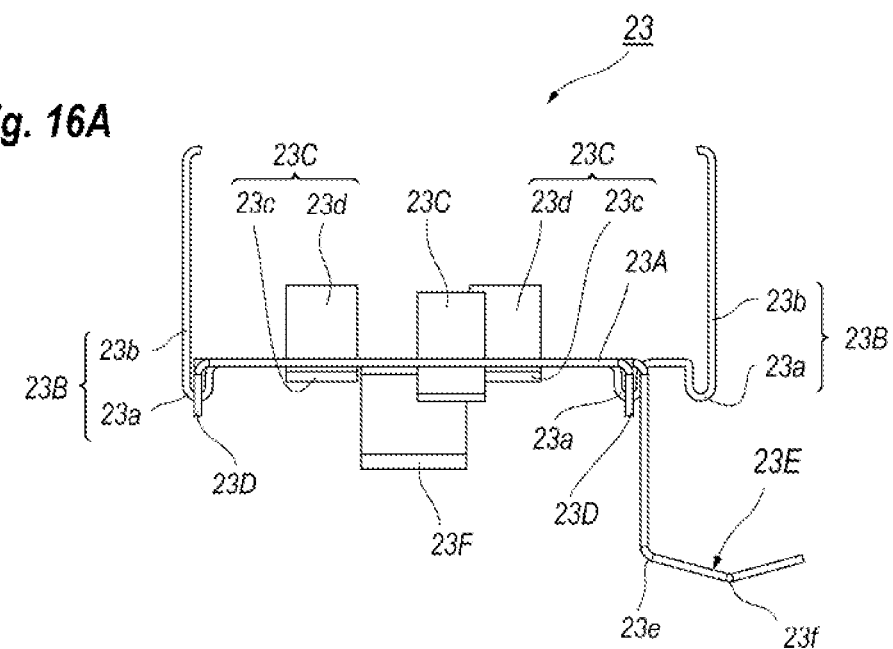
FIG. 16A is a side view of the holder.
Figure 16B:
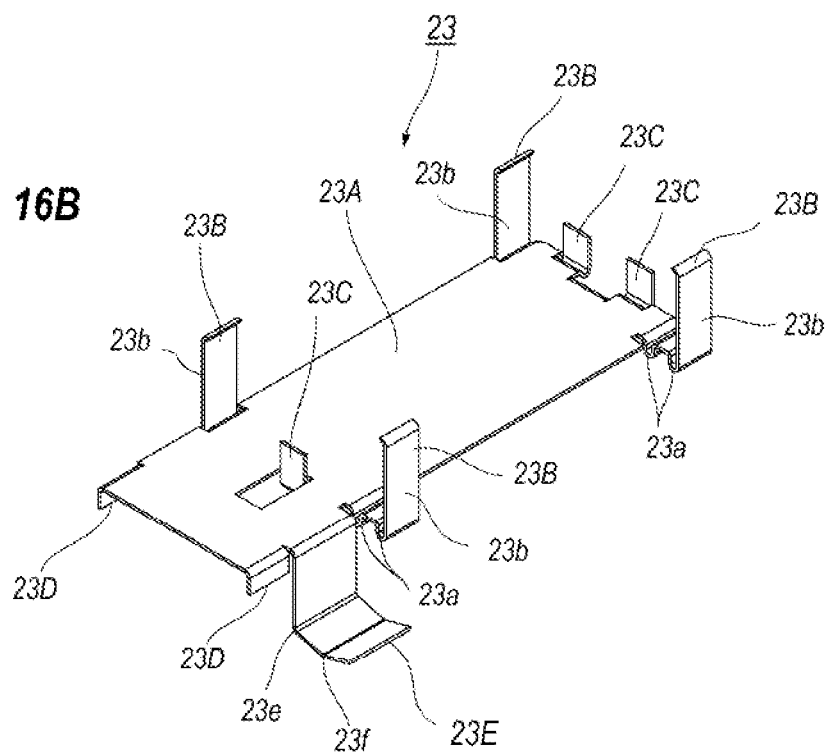
FIG. 16B is a perspective view of the holder.

FIGS. 16A and 16B show details of the holder 23, where FIG. 16A is a front view and FIG. 16B is a perspective view of the holder 23. The holder 23 provides four tabs 23B bent upward at respective sides of the base 23A, three tabs 23C also bent upward from the base 23A but a length thereof is shorter than the length of the former tabs 23B, two skirts 23D bent downward in respective front sides, a leg 23E bent downward from the base 23A and extended outward, and a rear leg 23F also bent downward at the rear end of the base 23A. The holder 23 of the present embodiment is made of stainless steel, but may be made of cupper alloys.

The tabs, 23B and 23C, hold the ICR 15 mounted on the base 23A. Specifically, the base 23A provides the former tab 23B in front and rear sides thereof. On the other hand, the base 23A provides one tab 23C in the front and the two tabs 23C in the rear edge, where all of the tabs, 23B and 23C, are bent upward to surround the ICR 15 mounted on the base 23A. The tab 23B is bent inward in a tip thereof, and a height thereof corresponds to a height of the ICR 15. Setting the ICR 15 on the base 23A, the ICR 15 may be slid off from the space surrounded by those tabs, 23B and 23C. The holder 23 exposes a top of the ICR 15 set on the base 23A thereof, and thus mounted ICR 15 in the top thereof may be in contact with the top housing 2 through a heat-dissipating sheet not illustrated in the figures.

Two tabs 23B provided along one side of the base 23A, which is outer side of the optical transceiver 1, has two elastic portions 23a each forming a U-shaped cross section. The other two tabs 23B also provided along another side, namely, an inner side of the optical transceiver 1, of the base 23A each has one elastic portion 23a also forming a U-shaped cross section. All tabs 23B provide a post 23b extending upward from the elastic portion 23a and the tip of respective posts are bent inward as described above. The tips of the elastic portions 23a, namely, the bottom of the U-shaped cross section, are in contact with the PCB 21.

The U-shaped cross section of the elastic portion 23a may form not only the gap S3 between the base 23A and the PCB 21 but a room for the corner of the ICR 15 not to interfere with the base 23A and the tab 23B. Comparing a structure where the post 23b is bend directly from the base 23A without forming the elastic portion 23a, the corner of the ICR 15 possibly comes in contact with a corner between the tab 23B and the base 23A, which sometimes pushes the tab 23B outward and the ICR 15 may be not securely set on the base 23A. The elastic portion 23a with the U-shaped cross section removes the corner between the tab 23B and the base 23A, which stably sets the ICR 15 on the base 23A. Moreover, as described above, the U-shaped cross section of the elastic portion 23a may operate as a spacer to form the gap S3.

The holder 23 also provides another tab 23C in one edge of the base 23A. The tab 23, which has a height smaller than the height of the former tab 23B, also accompanies with an elastic portion 23c with the U-shaped cross section in the root thereof and a post 23d extended upward from the elastic portion 23c. However, the U-shaped elastic portion 23c has a height smaller than the former elastic portion 23a. That is, the elastic portion 23c is formed only for providing a room for the corner of the ICR 15 and is not in contact with the PCB 21.

Figure 17:
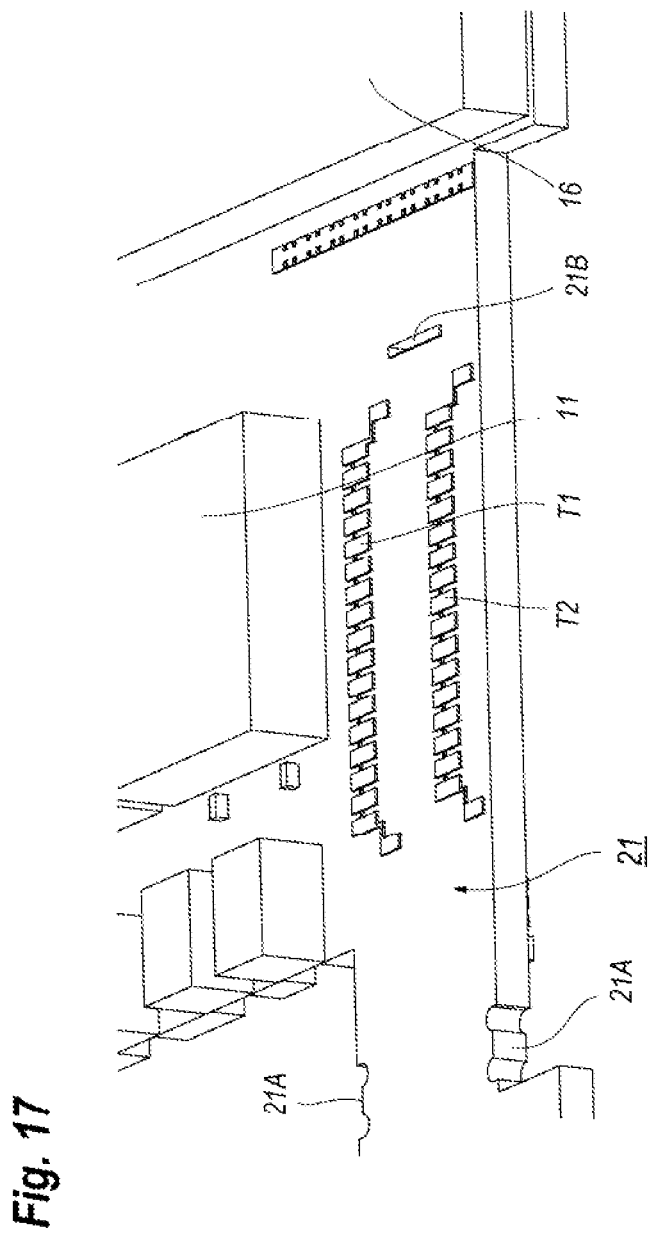
FIG. 17 indicates a position on the PCB where the ICR is to be mounted.

The skirts 23D bent downward from the base 23A have a length longer than the height or depth of the elastic portion 23a. As shown in FIG. 17, the skirts 23D are set within the cuts 21A of the PCB 21 and put the PCB 21 therebetween to position the holder 23 with respect to the PCB 21. The rear leg 23F bent downward from the base 23A has a length further longer than the length of the skirt 23D. The rear leg 23F is set within the slit 21B and passes through the PCB 21 to position the holder 23 along the longitudinal direction. The other leg 23E provides two bent portions, 23e and 23f, which forms a pocket to set the PMC 14 thereon. That is, two bent portions, 23e and 23f, forms the pocket, and the space formed by the pocket and the PCB 21 sets the PMC 14 therein, as shown in FIG. 14. The PMC 14 and the ICR 15 in the housings thereof provide the signal ground which is preferably isolated from the chassis ground. The pocket formed by two bent portions, 23e and 23f, and the PCB 21 may effectively isolate the PMC 14 from the housing of the optical transceiver 1.

In the foregoing detailed description, the method and apparatus of the present invention have been described with reference to specific exemplary embodiments thereof. It will, however, be evident that various modifications and changes may be made thereto without departing from the broader spirit and scope of the present invention. For instance, the embodiment concentrates on the FPCs, 22A and 22B, connective the ICR 15 with the PCB 21, and the holder 23 configured to mount the ICR 15 thereon. However, the holder 23 and the FPCs, 23A and 23B, in particular, the assembly with the ICR 15 thereof is applicable to components except for the ICR 15. Also, although the embodiment concentrates on the optical modulator 12 of the type of the LN modulator, the optical transceiver 1 of the present invention may implement with an optical modulator primarily made of semiconductor materials. Accordingly, the present specification and figures are accordingly to be regarded as illustrative rather than restrictive.

What is claimed is:

1. An optical transceiver comprising:
an optical module to receive an optical signal, the optical module having a first lead pin in a side thereof; and
a printed circuit board (PCB) to mount an electronic circuit communicating with the optical module through a first flexible printed circuit (FPC) board, the PCB mounting the optical module thereon through a holder, the holder forming a gap against the PCB,
wherein the first FPC board is fixed to a first pad on the PCB by soldering, extracted outwardly from the first pad, passes through the gap between the holder and the PCB, and connected to the first lead pin of the optical module.

2. The optical transceiver of claim 1,
wherein the first pad is disposed beneath the optical module.

3. The optical transceiver of claim 2,
where the optical module communicates with the electronic circuit through a second FPC board which is fixed to a second pad on the PCB, extracted outwardly from the second pad as passing through the gap between the holder and the PCB, and connected to a second lead pin of the optical module, the second lead pin being provided in another side opposite to the side where the first lead pin is formed, and
wherein the first FPC board is coupled with the first lead pin from a first direction and the second FPC board is coupled with the second lead pin from a second direction opposite to the first direction.

4. The optical transceiver of claim 3,
wherein the first direction is a direction from the PCB to the optical module, and the second direction is another direction from the optical module to the PCB.

5. The optical transceiver of claim 3,
wherein the first FPC board and the second FPC board are folded in a side of the optical module where the second lead pin is provided.

6. The optical transceiver of claim 3,
wherein the second pad is disposed beneath the optical module.

7. The optical transceiver of claim 3,
wherein the first pad is positioned in a deeper side compared with the second pad measured from an edge of the PCB through which the first FPC board and the second FPC board are extracted.

8. The optical transceiver of claim 1,
wherein the holder provides a base and a plurality of tabs, the base mounting the optical module thereon, the tabs including an elastic portion and a post, the elastic portion being bent downward from an edge of the base then folded upward to form a U-shaped cross section and connected to the post, the elastic portion being in contact with the PCB by a bottom of the U-shaped cross section to form the gap against the PCB.

9. The optical transceiver of claim 8,
wherein the post provides a tab in an end thereof, the tab being bent inward to hold the optical module.

10. The optical transceiver of claim 8,
wherein the holder further provides a rear leg bent downward form an edge of the base of the holder, the rear leg being inserted in to a slit provided in the PCB.

* * * * *